US012705523B2

(12) United States Patent
Shedd et al.

(10) Patent No.: US 12,705,523 B2
(45) Date of Patent: Aug. 11, 2026

(54) QUBIT READOUT PUMP SUPPRESSION METHOD

(71) Applicant: Millimeter Wave Systems, LLC, Amherst, MA (US)

(72) Inventors: William R. Shedd, Palmer, MA (US); James R. Strickland, Shutesbury, MA (US); Christopher T. Koh, Amherst, MA (US); Kenneth R. Wood, Hadley, MA (US)

(73) Assignee: Millimeter Wave Systems, LLC, Amherst, MA (US)

( * ) Notice: Subject to any disclaimer, the term of this patent is extended or adjusted under 35 U.S.C. 154(b) by 479 days.

(21) Appl. No.: 18/224,411

(22) Filed: Jul. 20, 2023

(65) Prior Publication Data

US 2025/0148332 A1 May 8, 2025

Related U.S. Application Data

(60) Provisional application No. 63/391,525, filed on Jul. 22, 2022.

(51) Int. Cl.

| | |
|---|---|
| ***H03F 19/00*** | (2006.01) |
| ***G06N 10/40*** | (2022.01) |
| ***H03F 7/00*** | (2006.01) |

(52) U.S. Cl.
CPC ............... *G06N 10/40* (2022.01); *H03F 7/00* (2013.01); *H03F 19/00* (2013.01); *H03F 2200/171* (2013.01)

(58) Field of Classification Search
CPC ...... H03F 7/00; H03F 2200/171; H03F 19/00; G06N 10/40; G06N 10/70
USPC .................................................. 330/4–6, 4.5
See application file for complete search history.

(56) References Cited

U.S. PATENT DOCUMENTS

| | | | |
|---|---|---|---|
| 10,903,809 B2 * | 1/2021 | White .................... | G06N 10/40 |
| 2018/0067182 A1 | 3/2018 | Clerk et al. | |
| 2019/0022969 A1 | 1/2019 | Kozan et al. | |
| 2022/0140927 A1 | 5/2022 | Bronn et al. | |
| 2022/0337207 A1 | 10/2022 | Naaman et al. | |

* cited by examiner

*Primary Examiner* — Andrea Lindgren Baltzell
*Assistant Examiner* — Khiem D Nguyen
(74) *Attorney, Agent, or Firm* — David J. Thibodeau; VLP Law Group LLP

(57) ABSTRACT

A qubit readout device that suppresses an unwanted pump leakage signal using an absorptive notch filter. The notch filter allows for two distinct ranges of passing frequencies above and below a notch frequency.

7 Claims, 3 Drawing Sheets

- PRIOR ART -

QUBIT READOUT PUMP SUPPRESSION METHOD

Statement Of Government Rights

This invention was made with government support under Grant No. 2025848 awarded by the National Science Foundation (NSF) SBIR (small business grant) The government has certain rights in this invention.

CROSS REFERENCE TO RELATED APPLICATIONS

This application is related to U.S. Provisional Application Ser. No. 63/391,525 filed Jul. 22, 2022, the entire contents of which are hereby incorporated by reference.

TECHNICAL FIELD

The application applies to superconducting quantum computer readout electronics.

BACKGROUND

In the field of super-conducting quantum computing, the output of a qubit is commonly measured using a microwave resonator that is coupled to the qubit. The output of the measurement resonator, sometimes referred to as the qubit readout, produces a weak microwave or radio frequency (RF) signal that requires amplification and detection. It is desirable to limit the additive noise of an initial first-stage amplifier device to near the quantum noise limit. This requires cryogenic cooling of at least the first-stage amplifier. Parametric amplifiers, such as transimpedance amplifiers or travelling wave amplifiers, are commonly deployed as first-stage amplifiers for this purpose. Parametric amplifiers use a mixing process that combines a weak signal with a larger pump signal to produce amplification of the weak signal. The circuits used to amplify the qubit readout should also be configured so as to not disturb the state of the qubit.

White et al., in U.S. Pat. No. 10,903,809 B2 describes a readout device wherein a filter defines a filter frequency range over which the readout measurement signals will pass, while the pump signal is outside of that range.

SUMMARY

The present disclosure relates to a circuit that is used to suppress unwanted pump leakage signal using an absorptive notch filter that allows for two distinct ranges of passing frequencies above and below the notch frequency.

Since many types of parametric amplifiers will act to amplify signals above and below the pump, this arrangement has the advantage of providing twice the total operating bandwidth with two distinct ranges.

Furthermore, a notch filter can be constructed in a way that absorbs or terminates the pump signal as opposed to rejecting the unwanted signal by reflection as is the case with common microwave filters. By absorbing the pump signal, the circuit will have reduced gain ripples that would have been created by interference between the reflected pump signals and the primary pump signal.

The notch filter can be used with any qubit resonator frequency that differs from the pump frequency since the filter suppresses only the pump frequency. This allows the system to maximize its usable bandwidth.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

DETAILED DESCRIPTION OF PREFERRED EMBODIMENTS

Figure 1:
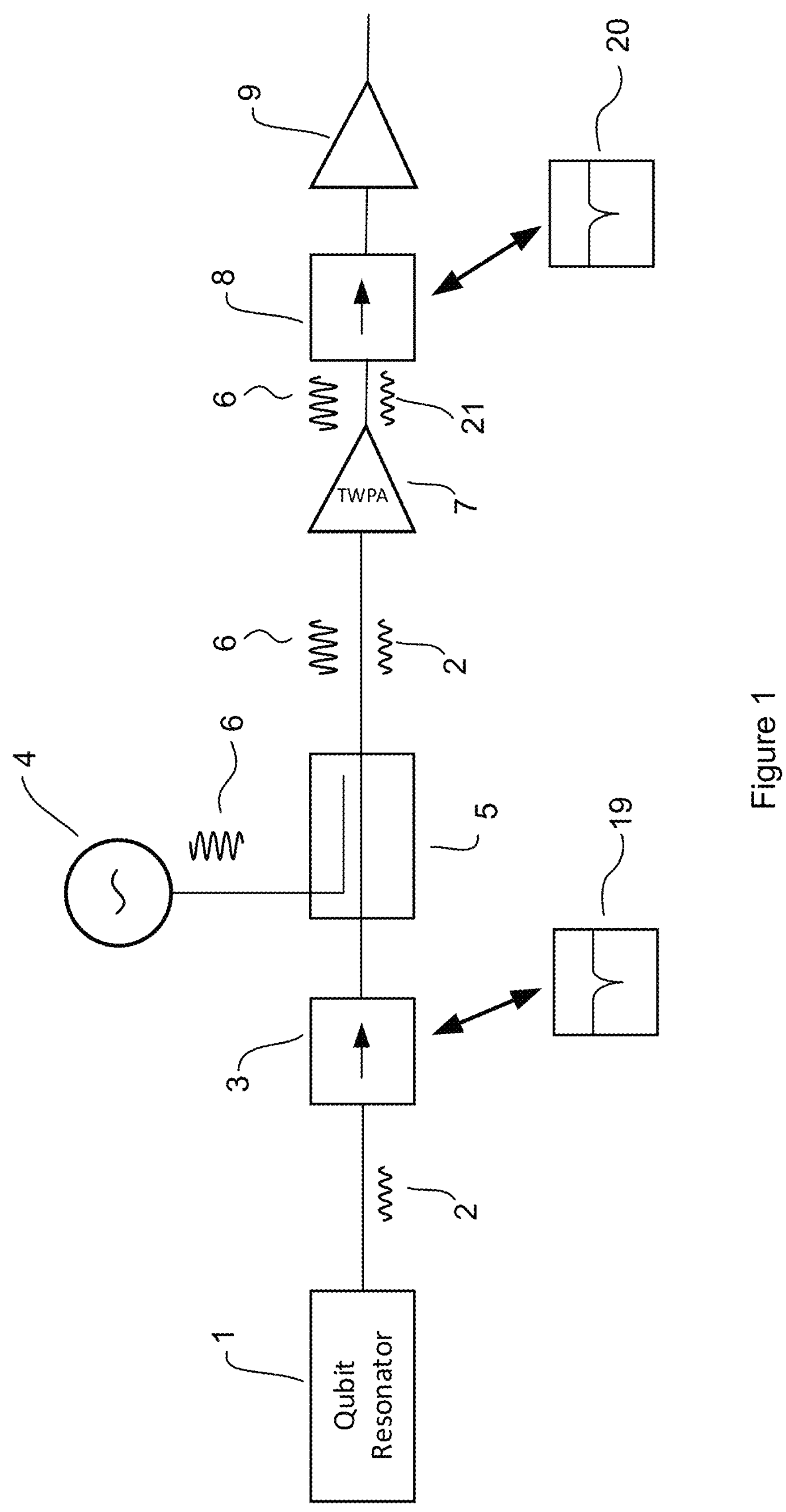
FIG. 1 is an example block diagram of a qubit resonator readout chain employing a traveling wave parametric amplifier, consistent with an illustrative embodiment.

A typical qubit readout chain containing a parametric amplifier is shown in FIG. 1. Weak radio frequency signal(s) 2 output from a qubit resonator 1 travel along a transmission line through an isolator 3 and directional coupler 5. The weak signal(s) 2 are amplified using a quantum limited parametric amplifier 7. A large radio frequency "pump" signal 6 is generated by a pump source 4. The pump signal 6 is added to the input of the parametric amplifier 7 via the high-directivity microwave directional coupler 5. Non-linear mixing of the two signals occurs in the parametric amplifier 7 resulting in an amplified weak signal 21.

The coupler 5 is oriented to limit the level of the pump signal 6 that propagates in a direction opposite of the signal back toward the qubit measurement resonator 1. In practice, some leakage still gets through. In addition, impedance mismatch at the parametric amplifier 7 will reflect the pump signal back toward the qubit resonator 1. Any pump signal that reaches the readout resonator 1 could degrade the performance of the quantum circuit. One or more microwave isolators 3 may be used between qubit resonator 1 and the coupler 5 to isolate the qubit resonator 1 from these unwanted pump leakage signals.

According to the teachings herein, a notch (also called a "band-stop" or "band-reject") filter 19 is disposed between the coupler 5 and qubit resonator 1 to provide isolation in addition to, or in place of, the isolator 3.

The notch filter 19 suppresses leakage of the pump signal 6 created by mismatch at the parametric amplifier 7 that reflects the pump signal back toward the qubit resonator 1. The notch filter 19 also suppresses intrinsic leakage of the pump signal 6 in the coupler 5.

With the addition of an absorption (reflectionless) characteristic of the notch filter 19, undesirable reflections of the pump signal 6 are terminated and do not reflect toward the parametric amplifier 7. In this way, absorption prevents reflected leakage from interfering with the primary pump signal 6 that could cause undesirable amplitude ripples that vary with frequency.

In another embodiment, a separate notch filter 20 in FIG. 1, also with the same notch frequency as the pump signal 6, is optionally located between the output of the parametric amplifier 7 and the next component in the chain. The separate notch filter 20 may replace or augment the output isolator 8. This separate notch filter 20 suppresses the pump signal 6 and reduce the pump signal amplitude relative to the amplified qubit signal 21 before it reaches a next amplifier 9. Reducing the pump signal 6 at the input to the amplifier 9 helps prevent remaining components in the readout chain from saturating in a way that could reduce system gain or produce unwanted intermodulation products.

The separate notch filter 20 can also prevent or reduce the production of intermodulation products in the next device(s) in the readout chain. If the notch filter is absorptive, it may have the added benefit of terminating the pump signal 6, rather than reflecting the pump signal back to the parametric amplifier 7 where it could interfere with the forward propagating pump signal.

Figure 2:
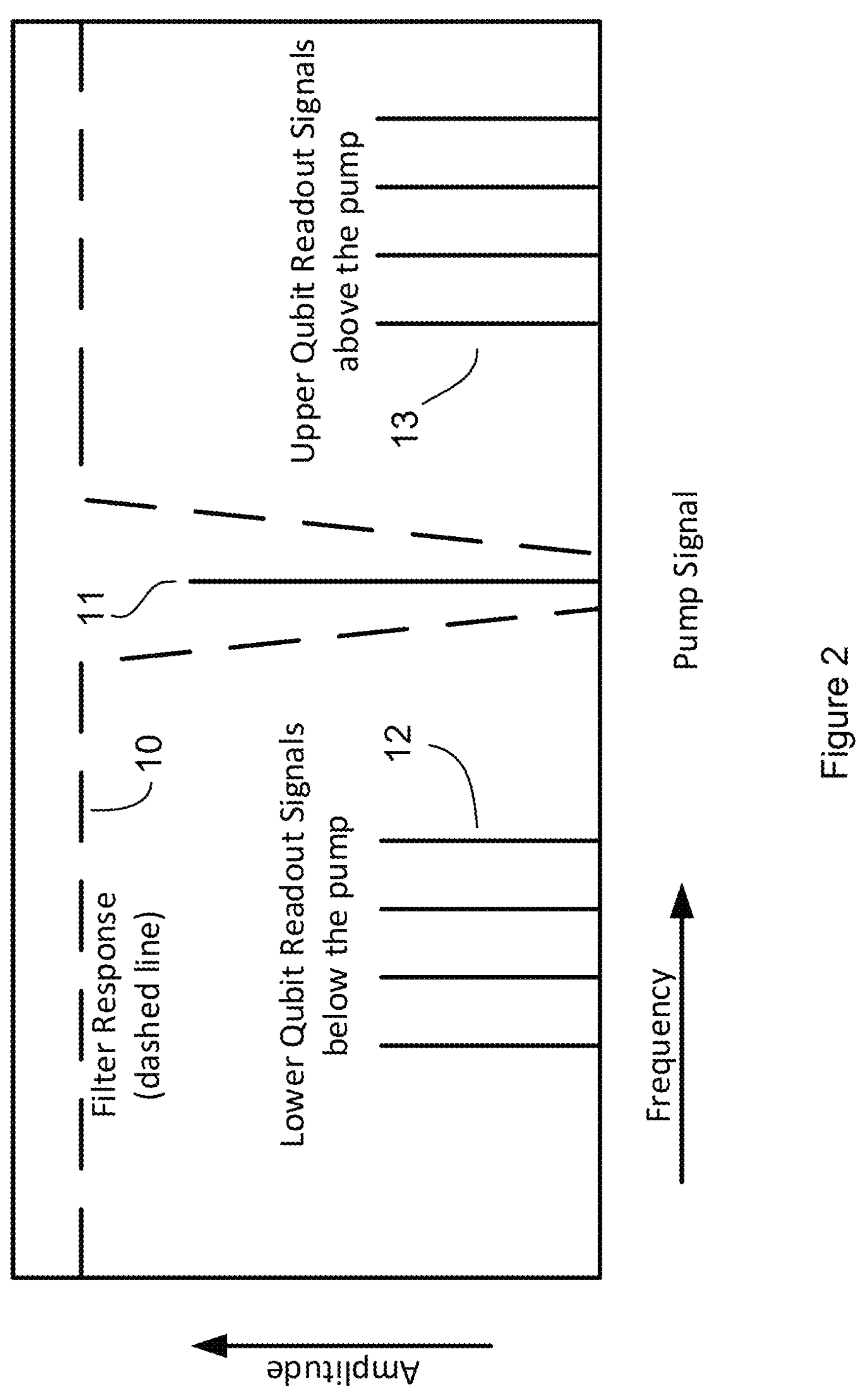
FIG. 2 is a graph of signals incident on a parametric amplifier's input in an example where several qubit readout signals are amplified above and below a notch filter's notch frequency, consistent with an illustrative embodiment.

Referring to FIG. 2, a notch filter 19 or 20 is designed with a frequency response 10 with a notch in amplitude at or near the pump frequency 11. As a result, the notch filter 19 or 20 attenuates the pump frequency 11 while passing a range in frequency above the pump frequency where upper qubit readout frequencies 13 can pass relatively unimpeded, and, simultaneously, passing a second range in frequency below the pump frequency 11 where lower qubit readout frequencies 12 can pass relatively unimpeded.

Further, a loss mechanism can be introduced in such a way to cause the filter to absorb at the pump frequency. In particular, the absorptive notch filter may have a lossy element or elements, typically containing a resistive material, that absorbs at the notch frequency. This differs from a common reflective filter that rejects primarily by reflection back to the source. The absorptive filter absorbs energy in the notch, while absorption and loss are minimized outside the notch.

An ideal notch filter would have rejection at one frequency and pass all other frequencies. However in practice the notch filter would typically have some frequency roll-off and rejection bandwidth. The rejection bandwidth is preferably small compared to the upper and the lower passing frequency ranges. The rejection bandwidth could be for example, 1 MHz or 10 MHz or 100 MHz, whereas the upper and lower passing bands would likely only be constrained by other parts of the system. Qubit readout frequencies could be above and below the pump and separated from the pump by ±10 MHz, ±100 MHZ, ±1 GHz, ±2 GHz, or ±5 GHz as examples.

Figure 3:
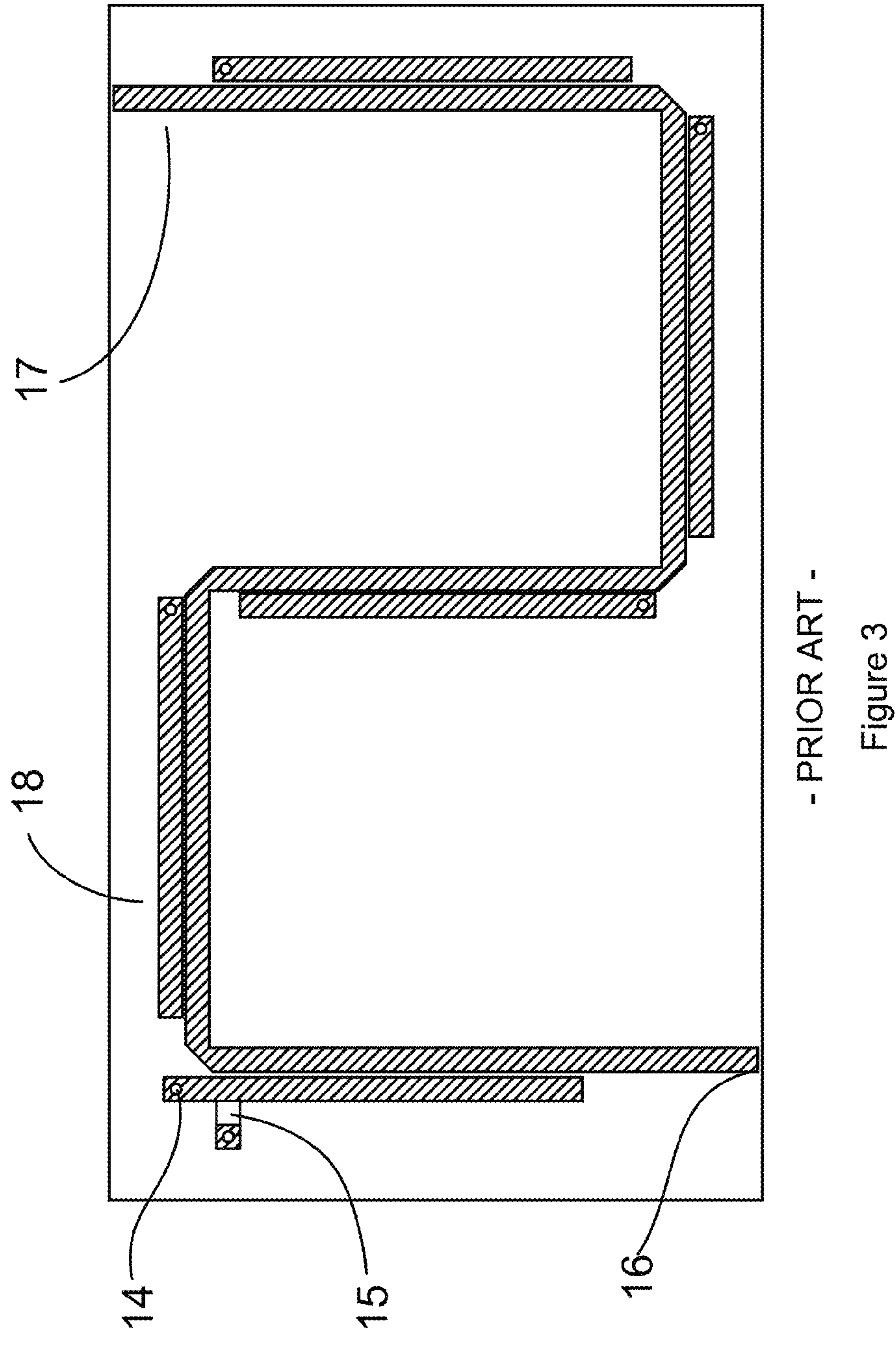
FIG. 3 illustrates an implementation of an absorptive notch filter.

One possible implementation of the absorptive notch filter is a transmission line constructed of one or more coupled resonators, wherein one or more resonators contain lossy elements. The lossy elements may be implemented using a material such as nichrome (NiCr). Nichrome does not superconduct and remains lossy at cryogenic temperatures at levels used in superconducting quantum computers. One example, similar to Jhih-Ying Shao and Yo-Shen Lin, "Millimeter-wave Bandstop Filter with Absorptive Stopband" 2014 IEEE MTT-S International Microwave Symposium, of a microstrip coupled line resonator filter is shown in FIG. 3 and uses coupled ¼-wave resonators. The absorptive filter is implemented with 50 Ohm transmission line input 16 and output 17. One or more coupled line resonator(s) 18, approximately a quarter wavelength long and are shorted at one end. In the example of FIG. 3, one resonator contains a resistor 15 near a short 14. More than one resonator can have resistive elements.

Other types of resonators could be used, such as open half-wave coupled lines, rings, dielectric pucks, loaded cavities, unloaded cavities, and coaxial resonators. These resonators could be similarly loaded with lossy materials to provide absorption. The resulting absorptive notch filter would absorb at the notch frequency and pass at frequencies above and below the notch.

In one possible embodiment, multiple notch filters may be used to inhibit multiple pump frequencies. As an example, two pump frequencies could be used in a degenerate configuration, each with its own notch filter connected in series.

The above description has particularly shown and described example embodiments. However, it will be understood by those skilled in the art that various changes in form and details may be made therein without departing from the legal scope of this patent as encompassed by the appended claims.

The invention claimed is:

1. An apparatus comprising:

a qubit providing an output;

a parametric amplifier configured to amplify the output of the qubit upon receiving a pump signal having a pump frequency; and a notch filter configured to suppress transmission at the pump frequency and configured to pass frequencies in two ranges above and below the pump frequency.

2. The apparatus of claim 1, wherein the notch filter is absorptive at the notch frequency.

3. The apparatus of claim 2 wherein the notch filter further comprises coupled resonators.

4. The apparatus of claim 2 wherein the notch filter further comprises one or more coupled resonators, wherein one or more of the coupled resonators are lossy.

5. The apparatus of claim 3, wherein one or more of the coupled resonators are lossy resonators composed of nichrome (NiCr) material.

6. The apparatus of claim 1, additionally comprising:

a coupler, coupled to provide the pump signal to the parametric amplifier; and wherein the notch filter is disposed between the qubit and the coupler.

7. The apparatus of claim 1, wherein the notch filter is disposed at an output of the parametric amplifier.

* * * * *